United States Patent [19]
Nguyen et al.

[11] Patent Number: 5,510,278
[45] Date of Patent: Apr. 23, 1996

[54] METHOD FOR FORMING A THIN FILM TRANSISTOR

[75] Inventors: Bich-Yen Nguyen; Thomas F. McNelly; Philip J. Tobin; James D. Hayden, all of Austin, Tex.

[73] Assignee: Motorola Inc., Schaumburg, Ill.

[21] Appl. No.: 300,770

[22] Filed: Sep. 6, 1994

[51] Int. Cl.⁶ .................................. H01L 21/786
[52] U.S. Cl. .................... 437/40; 437/21; 437/52; 148/DIG. 109
[58] Field of Search .................. 437/40, 913, 21, 437/915, 56, 57, 58, 41

[56] References Cited

U.S. PATENT DOCUMENTS

| | | | |
|---|---|---|---|
| 4,463,492 | 8/1984 | Maeguchi | 437/21 |
| 4,554,572 | 11/1985 | Chatterjee . | |
| 4,808,555 | 2/1989 | Mauntel et al. | 437/191 |
| 5,039,622 | 8/1991 | Ishihara | 437/41 |
| 5,100,816 | 3/1992 | Rodder | 437/40 |
| 5,156,987 | 10/1992 | Sandhu et al. | 437/40 |
| 5,198,379 | 3/1993 | Adan | 437/21 |
| 5,212,399 | 5/1993 | Manning | 257/369 |
| 5,248,623 | 9/1993 | Muto et al. | 437/21 |
| 5,266,507 | 11/1993 | Wu | 437/915 |
| 5,330,929 | 7/1994 | Pfiester et al. | 437/40 |
| 5,334,862 | 8/1994 | Manning et al. | 437/915 |
| 5,393,682 | 2/1995 | Liu | 437/909 |

*Primary Examiner*—Tom Thomas
*Assistant Examiner*—Michael Trinh
*Attorney, Agent, or Firm*—Kent J. Cooper

[57] ABSTRACT

An under-gated thin film transistor (54) having low leakage current and a high on/off current ratio is formed using a composite layer (40) of semiconducting material. In one embodiment a composite layer (40) of semiconducting layer is formed by depositing two distinct layers (34, 38) of semiconducting material over the transistor gate electrode (18). The composite layer (40) is then patterned and implanted with ions to form a source region (46) and a drain region (48) within the composite layer (40), and to define a channel region (50) and an offset drain region (52) within the composite layer (40).

13 Claims, 3 Drawing Sheets

5,510,278

METHOD FOR FORMING A THIN FILM TRANSISTOR

FIELD OF THE INVENTION

This invention relates generally to semiconductor devices, and more specifically to a thin film transistor and a method for the formation thereof.

BACKGROUND OF THE INVENTION

Thin film transistors (TFTs) are gaining acceptance in the semiconductor industry. In fact, TFT devices have already found application in both flat panel displays and in static memory devices. In the case of static memory devices, complementary metal oxide semiconductor (CMOS) and bipolar metal oxide semiconductor (BiCMOS) static random access memories (SRAMs) have in the past predominantly used polysilicon resistor load devices. The semiconductor industry's continual drive toward higher density SRAMs, however, makes the replacement of these traditional polysilicon resistor load devices with TFT devices very desirable. Both SRAMs and flat panel displays require well-behaved TFT devices that exhibit low leakage currents and high on/off current ratios and low defectivity. In addition, high density SRAMs require TFT devices that are compatible with small memory cell sizes.

Several different TFT devices such as, vertical, overgated, and undergated have been proposed in the past. However, the utilization of undergated TFTs in high density SRAMs has been limited. In an SRAM cell the drain electrode of the TFT must be electrically coupled to the control electrode of the latch transistor. However, electrically coupling the drain electrode of an under-gated TFT to the control electrode of the latch transistor requires an additional level of metallization. The area required for laying out the additional level of metallization is substantial and thus limits the memory cell size that can be achieved with under-gated TFTs. Accordingly, a need exists for a TFT device, which is compatible with high device density requirements.

SUMMARY OF THE INVENTION

The previously mentioned problems with existing TFT devices are overcome by the present invention. In one embodiment of the invention a thin film transistor is fabricated by forming a gate electrode that has a sidewall. A gate dielectric layer is then formed overlying the gate electrode. A first layer of semiconductive material is then formed overlying the gate dielectric layer. A portion of the first layer of semiconductive material is then etched to form an exposed portion of the gate dielectric layer. The exposed portion of the gate dielectric layer is then etched to define a contact opening. A second layer of semiconductive material is then formed overlying the first layer of semiconductive material to form a composite layer of semiconductive material overlying the gate dielectric layer. In addition, the second layer of semiconductive material is also formed such that it lies within the contact opening. The composite layer is patterned and source and drain regions are formed within the composite layer. The source and drain regions also define a channel region within a portion of the composite layer that overlies the gate electrode. Other aspects of the invention involve devices formed with the inventive process.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
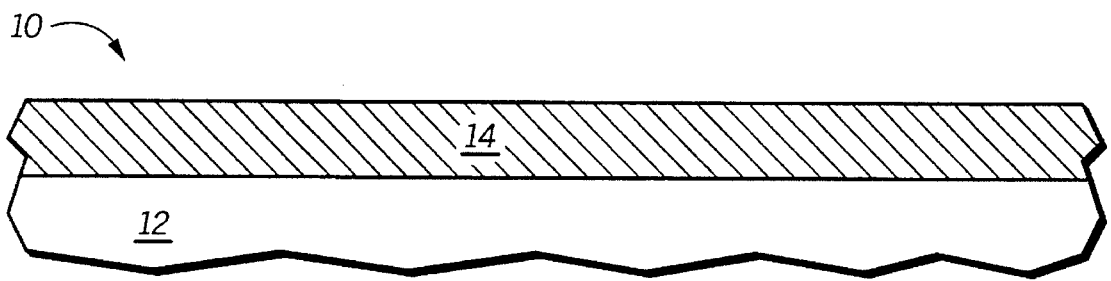
FIGS. 1–9 illustrate, in cross-section and in top view, process steps in accordance with one embodiment of the invention, wherein like reference numerals designate identical or corresponding parts throughout the several views.
Figure 2:
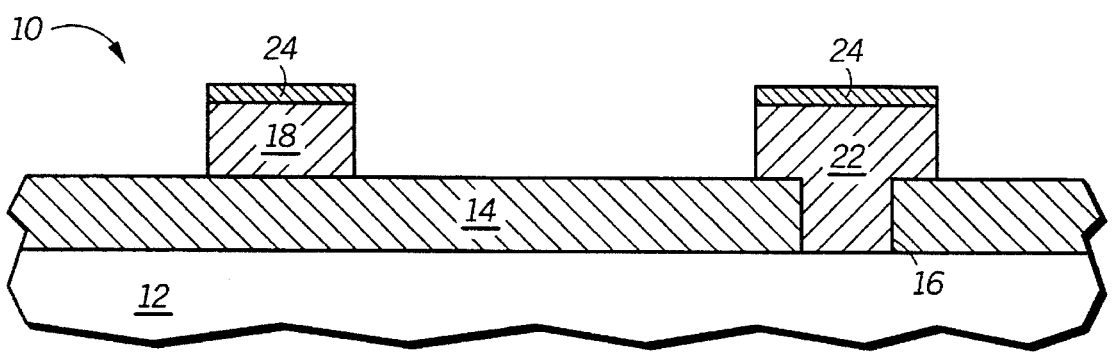

FIGS. 1 through 9 illustrate, in cross-section and in top view, process steps in accordance with one embodiment of the invention wherein a thin film transistor is formed. Shown in FIG. 1 is a portion 10 of an integrated circuit structure comprising a substrate 12 and a dielectric layer 14. Substrate 12 is preferably a semiconductor substrate such as a single crystal silicon substrate, a silicon on sapphire substrate, a silicon on insulator substrate, or the like. In addition, substrate 12 may have semiconducting devices such as transistors, capacitors, resistors, diodes, etc. are formed thereon. These devices, however, are not shown in order to simplify the drawings. Dielectric layer 14 may be a layer of silicon dioxide, silicon nitride, polyimide, or the like. In addition, dielectric layer 14 may be formed using conventional techniques, such as thermal oxidation, chemical vapor deposition, spin-on deposition, plasma deposition, or the like.:

In FIG. 2, a contact opening 16 is formed within dielectric layer 14 using conventional photolithographic patterning and etching techniques and a layer of conductive material is then deposited over dielectric layer 14 and within contact opening 16. The conductive layer of material is formed using conventional techniques and is preferably n+ or p+ polysilicon. Alternatively, the conductive layer may also be a metal, such as tungsten, or a metal silicide such as tungsten silicide or titanium silicide, or a polycide layer comprising metal silicide and doped polysilicon. A sacrificial layer of material is then formed overlying the conductive layer and the sacrificial layer and the conductive layer are subsequently patterned to form a gate electrode 18 and a contact region 22. Contact region 22 is electrically coupled to a portion of substrate 12. For example, in one embodiment contact region 22 is electrically coupled to the underlying gate electrode of a latch transistor in an SRAM memory cell. Alternatively, contact region 22 may be electrically coupled to an underlying doped region or to an underlying conductive interconnect. As shown in FIG. 2, the patterning process leaves a remaining portion 24 of the sacrificial layer overlying Contact region 22 and gate electrode 18. In one embodiment, remaining portion 24 is chemical vapor deposited silicon dioxide. Alternatively, remaining portion 24 may be thermally grown silicon dioxide or another material such as silicon nitride, silicon oxynitride, or the like. In addition, remaining portion 24 may also be a laminate comprising silicon dioxide and silicon nitride or a laminate comprising silicon dioxide and silicon oxynitride. It should be appreciated that the sacrificial layer may be advantageously used as an anti-reflective coating to reduce pattern distortion or reflective notching during the photolithographic patterning process.

Figure 3:
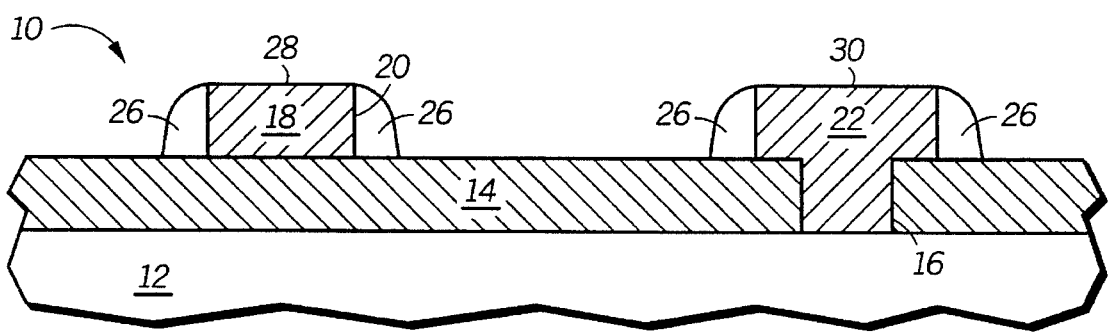

In FIG. 3, a layer of sidewall spacer material is then formed overlying gate electrode 18, contact region 22, and dielectric layer 14. The layer of sidewall spacer material is formed using conventional deposition techniques and is subsequently anisotropically etched to form a sidewall spacer 26 adjacent to sidewall 20 of gate electrode 18. In one embodiment sidewall spacer 26 is formed with silicon nitride. Alternatively, sidewall spacer 26 may be formed with other materials such as silicon dioxide, boron nitride, or the like. In one embodiment after sidewall spacer 26 has been formed remaining portion 24 is subsequently removed using a selective etch process to expose top surface 28 of gate electrode 18 and top surface 30 of contact region 22. For example, remaining portion 24 may be selectively removed with hydrofluoric acid if it is formed with silicon dioxide. Alternatively, remaining portion 24 may also be removed at the same time that sidewall spacer 26 is formed.

Figure 4:
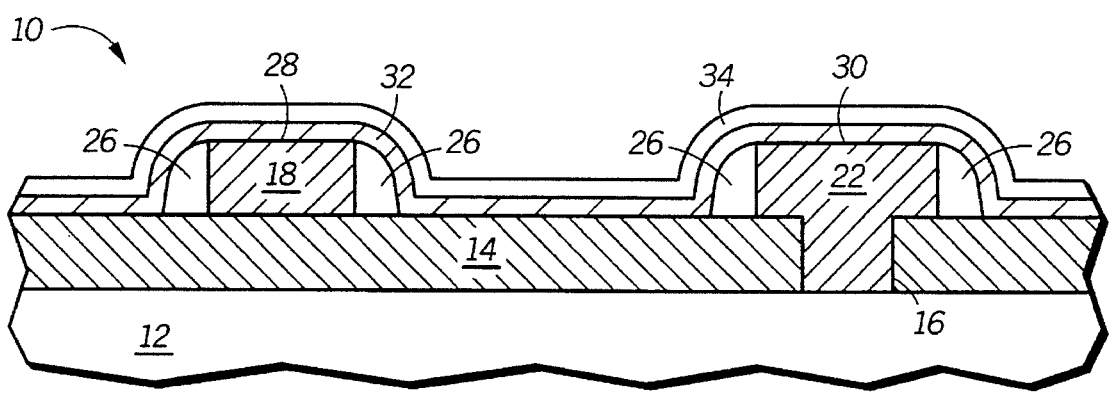

In FIG. 4, a gate dielectric layer 32 is then formed overlying top surface 28 of gate electrode 18 and top surface 30 of contact region 22. In one embodiment gate dielectric layer 32 is a layer of chemically vapor deposited silicon dioxide, that is deposited using tetraethylorthosilicate (TEOS) as a source gas, and that is subsequently densified in an ambient comprising oxygen. Alternatively, gate dielectric layer 32 may be a layer of thermally grown silicon dioxide, or a layer of silicon oxynitride, that is formed by annealing a deposited or thermally grown silicon dioxide layer in an ambient comprising ammonia (NH3), nitrous oxide (N2O) or nitric oxide (NO). A first layer 34 of semiconductive material is then formed overlying gate dielectric layer 32. First layer 34 is formed using conventional techniques and preferably has a thickness ranging from about 25 nanometers to about 75 nanometers. In one embodiment first layer 34 is a layer of amorphous silicon. Alternatively, first layer 34 may also be a layer of polysilicon, silicon-germanium, or the like.

Figure 5:
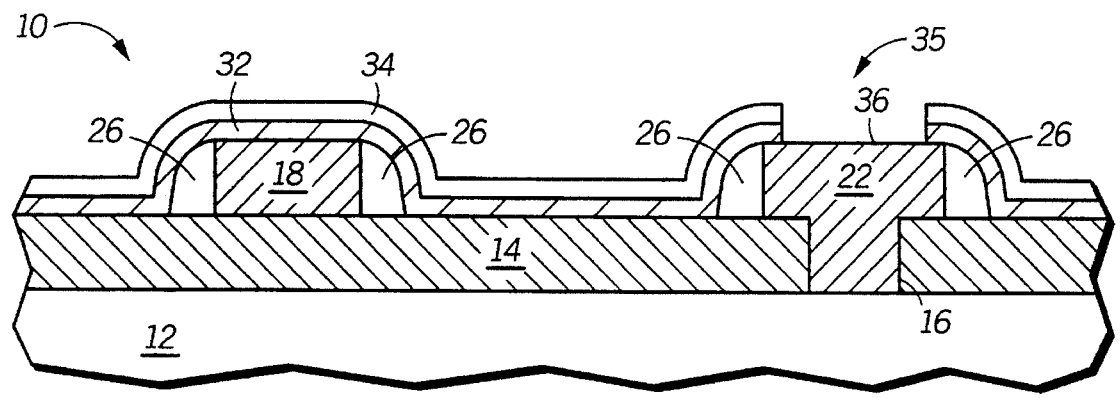

In FIG. 5, first layer 34 is then patterned using conventional photolithographic patterning and dry etching techniques to expose an underlying portion of gate dielectric layer 32. The exposed portion of gate dielectric layer is then subsequently removed with either a dry or wet etch to define a contact opening 35 and to expose a portion 36 of contact region 22.

Figure 6:
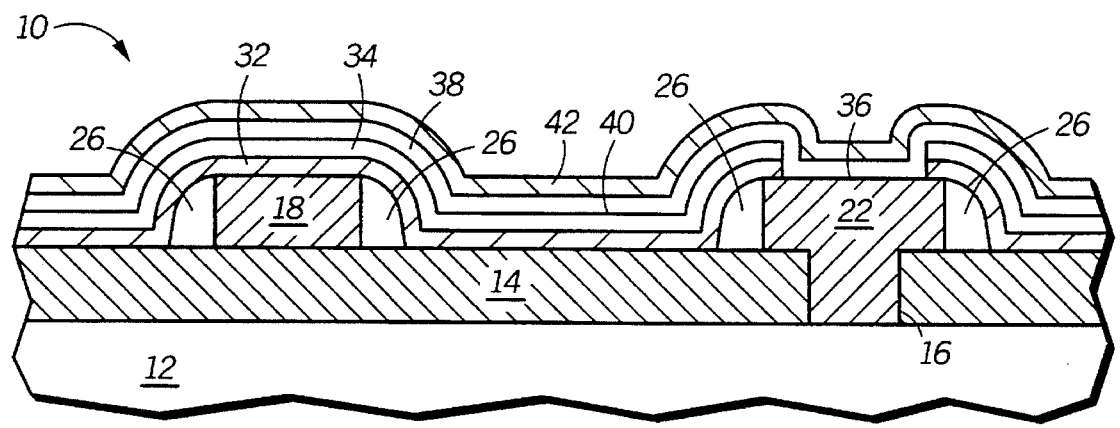

In FIG. 6, a second layer 38 of semiconductive material is then formed overlying first layer 34 to form a composite layer 40 of semiconductive material. In addition, second layer 38 is also formed within contact opening 35 and overlies exposed portion 36 of contact region 22 as shown in FIG. 6. Second layer 38 is formed using conventional techniques and preferably has a thickness ranging from about 25 nanometers to about 75 nanometers. In one embodiment second layer 38 is a layer of amorphous silicon. Alternatively, second layer 38 may also be a layer of polysilicon, silicon-germanium, or the like. In a preferred embodiment composite layer 40 has a thickness of less than 100 nanometers. In one embodiment a dielectric layer 42 is formed over composite layer 40 and then dielectric layer 42 and composite layer 40 are annealed in an ambient comprising oxygen. Alternatively, dielectric layer 42 and composite layer 40 may be annealed in an inert ambient. The anneal process densities composite layer 40 and passivates the grain boundaries of composite layer 40. In addition, it should also be appreciated that if first layer 34 and second layer 38 are formed with amorphous silicon then the anneal process may also be advantageously used to re-crystallize these amorphous silicon layers. In one embodiment dielectric layer 42 is a layer of chemically vapor deposited silicon nitride. Alternatively, dielectric layer 42 may be a layer of silicon oxynitride or silicon dioxide. In addition, dielectric layer 42 may also be a laminate comprising silicon dioxide and silicon nitride or a laminate comprising silicon dioxide and silicon oxynitride.

Figure 7:
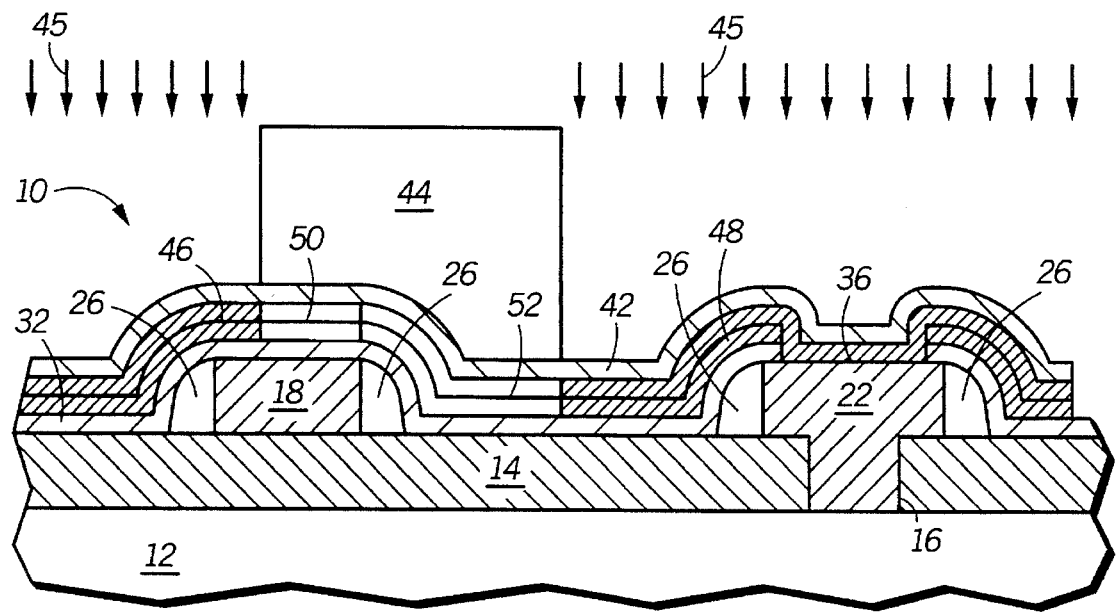

In FIG. 7, dielectric layer 42 and composite layer 40 are patterned using conventional photolithographic patterning and etching techniques. It should be appreciated that dielectric layer 42 may be advantageously used as an anti-reflective coating to reduce pattern distortion or reflective notching during the photolithographic patterning process. A photoresist mask 44 is then formed over a portion of composite layer 40, that is overlying gate electrode 18. Photoresist mask 44 is then used as an implantation mask and ions 45 are implanted into composite layer 40 to form a source region 46 and a drain region 48. In addition, in one embodiment the implantation process also defines a channel region 50 and an drain channel region 52 within composite layer 40. This embodiment is illustrated in FIG. 7, wherein channel region 50 is shown to overlie gate electrode 18 and offset drain region 52 is shown to lie in between channel region 50 and drain region 48. It should be appreciated that source region 46 and drain region 48 may be formed to have either an n-type or a p-type conductivity.

Figure 8:
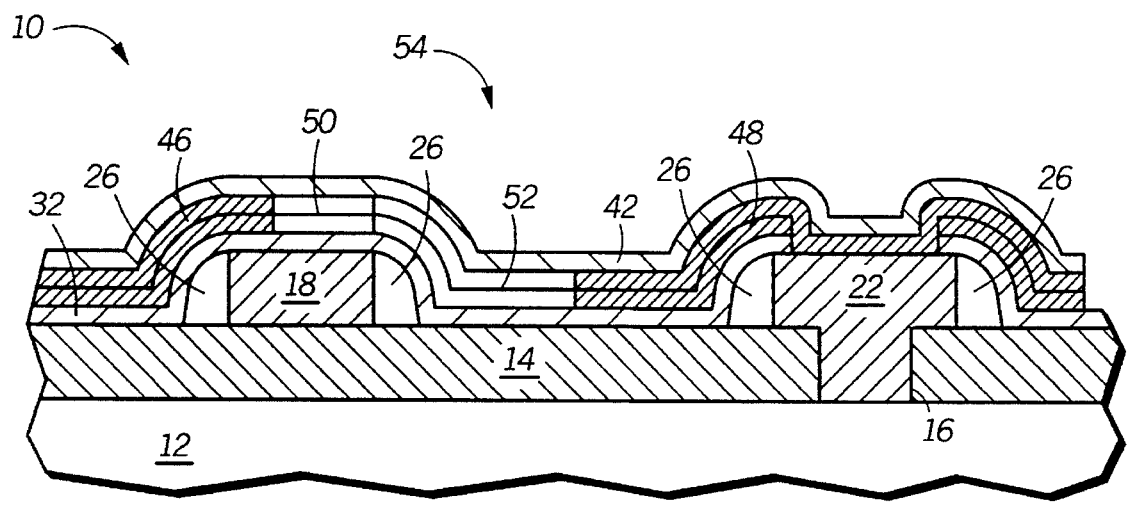

The photoresist mask 44 is then stripped and source region 46 and drain region 48 are annealed using conventional techniques. The resulting thin film transistor 54 is shown in FIG. 8. As shown, drain region 48 is electrically coupled to contact region 22 by a doped portion of second layer 38. Thus the inventive process allows drain region 48 to be electrically coupled to underlying devices without using an extra level of metallization. Therefore, the inventive process allows small SRAM memory cells to be fabricated with under-gated thin film transistors because an extra level of metallization is not required to electrically couple the drain region of the under-gated thin film transistor to the gate electrode of a latch transistor. Moreover, the electrical characteristics of the thin film transistor are not adversely affected by forming the channel region, source region, and drain region of the thin film transistor within a composite layer of semiconductive material.

Figure 9:
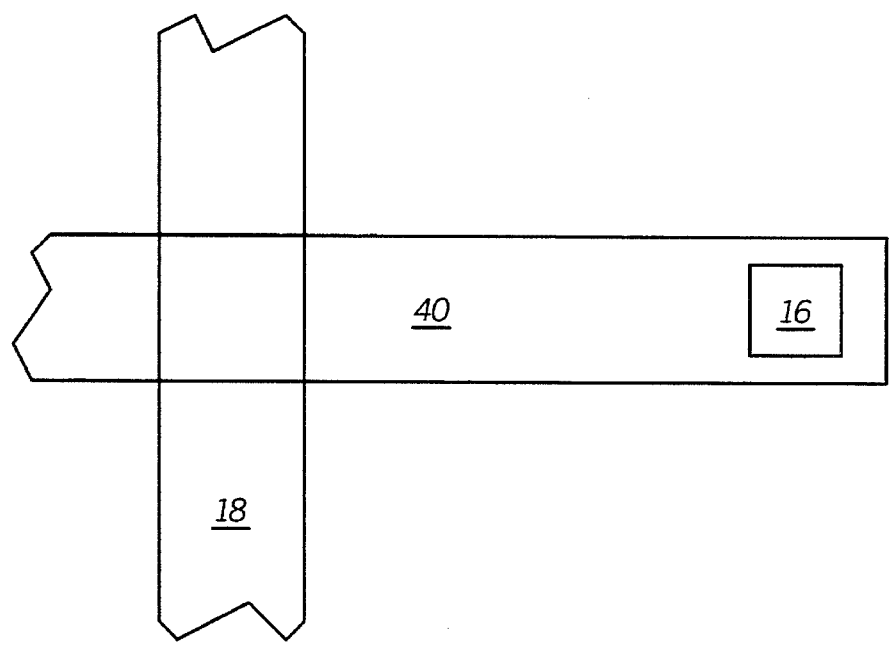

FIG. 9 is a top down view of FIG. 8. It should be appreciated from FIG. 9 that the inventive process could also be used to form an over-gated thin film transistor. Moreover, it should also be appreciated that a thin film transistor that is both over-gated and under-gated may also be formed using the inventive process.

The foregoing description and illustrations contained herein demonstrate many of the advantages associated with the present invention. In particular, it has been revealed that the source, drain, and channel regions of a thin film transistor may be formed within a composite layer of semiconducting material without adversely effecting its electrical characteristics. Yet another advantage is that the present invention allows high density SRAM's to be fabricated with under-gated thin film transistors because an additional level of metallization is not required to electrically couple the drain electrode of the under-gated thin film transistor to the gate electrode of the latch transistor.

Thus it is apparent that there has been provided, in accordance with the invention, a thin film transistor that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is envisioned that composite layer 40 may be formed with more than two layers of semiconducting material. In addition, the invention is not limited to the materials specifically recite herein. It is also important to note that the present invention is not limited in any way to a specific SRAM device or layout. Therefore, it is intended-that this invention encompass all such variations and modifications as fall within the scope of the appended claims.

We claim:

1. A method for forming a thin film transistor comprising the steps of:

providing a substrate;

forming a gate electrode overlying the substrate, the gate electrode having a sidewall;

forming a gate dielectric layer abutting at least a portion of the gate electrode;

forming a first layer of semiconductive material abutting at least a portion: of the gate dielectric layer;

etching a portion of the first layer of semiconductive material to form an exposed portion of the gate dielectric layer;

etching the exposed portion of the gate dielectric layer to define a contact opening therein;

forming a second layer of semiconductive material overlying the first layer of semiconductive material to form a composite layer of semiconductive material overlying the gate dielectric layer, wherein the second layer of semiconductive material also lies within the contact opening;

patterning the composite layer; and forming a source region within a first portion of the composite layer and a drain region within a second portion of the composite layer, wherein the source and drain regions define a channel region within a third portion of the composite layer that overlies the gate electrode.

2. The method of claim 1, further comprising the step of forming a sidewall spacer adjacent to the sidewall of the gate electrode prior to forming the gate dielectric layer.

3. The method of claim 1, wherein the step of forming the first layer of semiconductive material is further characterized as depositing a layer of amorphous silicon.

4. The method of claim 1, wherein the step of forming the first layer of semiconductive material is further characterized as depositing a layer of polysilicon.

5. The method of claim 1, wherein the step of forming the gate dielectric layer comprises chemically vapor depositing a layer of silicon dioxide.

6. The method of claim 5, wherein the step of forming the gate dielectric layer further comprises the step of annealing the layer of silicon dioxide.

7. The method of claim 1, wherein the step of forming the source and drain regions is further characterized as forming the source and drain regions such that an offset drain region is defined within a fourth portion of the composite layer, wherein the offset drain region lies in between the channel region and the drain region.

8. A method for forming a thin film transistor comprising the steps of:

providing a substrate;

forming a gate electrode overlying the substrate, the gate electrode having a sidewall;

forming a gate dielectric layer abutting at least a portion of the gate electrode;

depositing a first amorphous silicon layer abutting at least a portion of the gate dielectric layer;

etching a portion of the first amorphous silicon layer to form an exposed portion of the gate dielectric layer;

etching the exposed portion of 7the gate dielectric layer to define a contact opening therein;

depositing a second amorphous silicon layer overlying the first amorphous silicon layer to form a composite layer of semiconductive material, wherein the second amorphous silicon layer also lies within the contact opening;

annealing the composite layer of semiconductive material to recrystallize the first and second amorphous silicon layers;

patterning the composite layer; and forming a source region within a first portion of the composite layer and a drain region within second portion of the composite layer, wherein the source region and drain region define a channel region within a third portion of the composite layer that overlies the gate electrode.

9. The method of claim 8, further comprising the step of forming a sidewall spacer adjacent to the sidewall of the gate electrode prior to forming the gate dielectric layer.

10. The method of claim 8, further comprising the step of forming a dielectric layer overlying the second amorphous silicon layer prior to re-crystallizing the first and second amorphous silicon layers.

11. The method of claim 8, wherein the step of forming the gate dielectric layer comprises chemically vapor depositing a layer of silicon dioxide.

12. The method of claim 11, wherein the step of forming the gate dielectric layer further comprises the step of annealing the layer of silicon dioxide.

13. The method of claim 8, wherein the step of forming the source and drain regions is further characterized as forming the source and drain regions such that an offset drain region is defined within a fourth portion of the composite layer, wherein the offset drain region lies in between the channel region and the drain region.

* * * * *

UNITED STATES PATENT AND TRADEMARK OFFICE
CERTIFICATE OF CORRECTION

PATENT NO.   : 5,510,278
DATED        : April 23, 1996
INVENTOR(S)  : Bich-Yen Ngueyn, Thomas F. McNeily, Philip J. Tobin, James D. Hayden It is certified that error appears in the above-indentified patent and that said Letters Patent is hereby corrected as shown below:

Column 6, line 17: delete the "7"

Signed and Sealed this

Seventh Day of October, 1997

Attest:

BRUCE LEHMAN

Attesting Officer         Commissioner of Patents and Trademarks